United States Patent
Leng et al.

(10) Patent No.: US 7,062,741 B1
(45) Date of Patent: Jun. 13, 2006

(54) WIRE BOND PADRING BOND PAD CHECKER PROGRAM

(75) Inventors: Allen Cheah Chong Leng, Bayan Lepas (MY); Tan Ping Chet, Gelugor (MY)

(73) Assignee: Altera Corporation, San Jose, CA (US)

( * ) Notice: Subject to any disclaimer, the term of this patent is extended or adjusted under 35 U.S.C. 154(b) by 568 days.

(21) Appl. No.: 10/351,101

(22) Filed: Jan. 23, 2003

(51) Int. Cl.
*G06F 17/50* (2006.01)

(52) U.S. Cl. .................... 716/11; 716/1; 716/5; 716/12

(58) Field of Classification Search .................... 716/1, 716/5, 11, 12; 324/765
See application file for complete search history.

(56) References Cited

U.S. PATENT DOCUMENTS 6,262,587 B1 * 7/2001 Whetsel ..................... 324/765

* cited by examiner

*Primary Examiner*—Thuan Do
(74) *Attorney, Agent, or Firm*—Beyer Weaver & Thomas, LLP

(57) ABSTRACT

A computer-implemented method is described for verifying bond pad position conformity with predetermined design rules corresponding to a padring design. The padring design includes a plurality of linear arrays of bond pads. Horizontal and vertical scribelines for the padring design are defined. A first one of the linear arrays of bond pads is selected. Each bond pad has associated position values. Bond pad position data are determined with reference to the scribelines and the associated position values. The bond pad position data are compared to the predetermined design rules. Where violations of the predetermined design rules exist, the violations are identified.

53 Claims, 3 Drawing Sheets

WIRE BOND PADRING BOND PAD CHECKER PROGRAM

BACKGROUND

The present invention relates to software tools for facilitating automated verification of microchip designs. More specifically, the present invention relates to an integrated design verification methodology which employs software design tools to effect an automated verification of wire bond padring bond pad layouts based on a predefined set of design rules.

In the designing of microchips, there are many critical stages to ensure a complete integration and compliance of design parameters that will aid in effecting a reliable transition between the different manufacturing processes involved in the microchip fabrication. For example, a designer typically is given a set of predefined padring design rules for the verification of wire bond padring bond pad layouts. The padring design rules generally set limits on the bond pads' position on the padring according to a corresponding die mask, which may depend on a particular chip design family. These limits are usually defined by the packaging group and used by the designer for verification before the microchip enters the packaging stage. In the past, the designer would conduct the design verification process by manually measuring the bond pad positions one by one and comparing the results to the set of predefined padring design rules. Once a violation is found, as when a measurement does not conform to the padring design rules, the designer takes note of it by writing the violation down into a notebook.

To aid a designer in the verification of each wire bond padring, there are a number of commercially available software design tools. Computer aided design (CAD) tools, such as AutoCAD® by Autodesk, Inc. of San Rafael, Calif., provides an integrated measuring feature that, when selected, allows the designer to perform a single measurement of the distance between two points on an electronic drawing illustrative of the wire bond padring. This single measurement is performed after clicking with a mouse onto two corresponding points of interest located on the drawing.

There are problems associated with using an integrated measuring feature as provided in current software design tools to perform the verification of wire bond padrings. One problem is that one or both of the two points is sometimes not readily available on the drawing for this feature to be used. That is, the points may need further drafting to actually define the points since the drawing originally includes minimal information, typically providing only a scaled electronic outline of an actual wire bond padring. For example, in order to use the center of an eight sided closed polygon shaped bond pad as one of the points for the measurement, a designer will need to specially draw onto the drawing intersecting centerlines for the eight sided closed polygon shaped bond pad.

Another problem associated with using an integrated measuring feature as provided in current software design tools is the lack of consistent accuracy rendered by the end user, the designer in the case of wire bond padring verification. Since a designer must literally pick each point of interest by using a mouse, the accuracy of retrieving the correct measurement is subject to where on the drawing he clicks his mouse. For example, if the designer wants to measure the distance between two specific endpoints of two separate lines, he may instead click onto points near the endpoints without knowing that the actual endpoints were not chosen. Therefore, an inaccurate measurement would result in an incorrect measurement of the specific endpoints. Although some software design tools provide object snapping capabilities, a feature that allows the automatic selection of certain object features as points of interest, these are also subject to the lack of consistent accuracy rendered by the designer. This is because it again depends on where the designer clicks his mouse and whether there are more than one of the same feature in the object being snapped upon. Again in measuring the distance between two specific endpoints of two separate lines, for example, the designer may instead click his mouse onto a portion of either of the two lines that automatically selects the other endpoint of the same line rather than his intended endpoint for measurement. Accordingly, an inaccurate measurement results in an incorrect measurement of the specific endpoints.

Furthermore, current software design tools lack the capability to systematically and efficiently handle the increasingly high number of wire bond padring verifications, especially when such verifications need to be done accurately and completely. As integrated circuits have become smaller in size and denser, the number of bond pads has accordingly increased. The aforementioned integrated measurement feature provided by software design tools only allows a designer to perform a single manual measurement at a time. With the current number of bond pads varying between 100 to 800 per microchip and having a possibility of up to six measurements per bond pad, wire bond padring verification has become a very tedious and mistake prone task involving significant resources in terms of manpower and time.

In addition, this task is often done randomly in a sampling fashion in order to keep up with the changing demands of other manufacturing processes and overall production throughput. That is, the designer often just randomly samples a few bond pads per wire bond padring for verification rather than verifying that every bond pad is in compliance. Due to the possible missed violations of the predefined set of design rules, this random sampling method has the potential to result in the costly repetition of the manufacturing processes involved in microchip fabrication.

It is therefore desirable to provide a design verification methodology and associated design tools with which a designer may efficiently and automatically verify wire bond padring bond pad layouts based on a predefined set of design rules.

SUMMARY

The present invention addresses the problem by providing an efficient and automated design verification methodology and associated design tools which a designer can use to verify whether a wire bond padring conforms to a predefined set of design rules.

In one aspect, the invention provides computer-implemented methods and apparatus (including computer-readable media and specially programmed computers) for verifying bond pad position conformity with predetermined design rules that correspond to a padring design with multiple linear arrays of bond pads. Horizontal and vertical scribelines for the padring design are defined. A first one of the linear arrays of bond pads is selected, each bond pad having associated position values. Bond pad position data are determined with reference to the scribelines and the associated position values without user intervention. The bond pad position data are compared to the predetermined design rules without user intervention. Any violations of the predetermined design rules are identified.

In another aspect, the invention provides an integrated circuit comprising a substrate and a padring corresponding to a padring design where the padring design has been verified according to the techniques of the present invention.

A further understanding of the nature and advantages of the present invention may be realized by reference to the remaining portions of the specification and the drawings.

DETAILED DESCRIPTION OF SPECIFIC EMBODIMENTS

The present invention will now be described in detail with reference to a few specific embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

According to the present invention, a design verification methodology is provided by which wire bond padring bond pad layouts are verified. The design verification methodology of the present invention provides an approach to the design process in which it employs software design tools to effect an automated verification of wire bond padring bond pad layouts based on a predefined set of design rules. The present invention provides a number of advantages with respect to previous ad hoc approaches. For example, it allows designers to automate the work of tedious manual checking wherein the manual checking partaken in the past involved random sampling or one by one tedious checking of bond pads to ensure compliance with predefined padring design rules. It also allows a faster lead time to do the checking (approximately 1 minute). Furthermore, it is more accurate than the human eye in that it measures the objects accurately. According to various embodiments, the invention also provides an approach in which it checks all bond pads that fall within a window fencing command. Any tendency to miss a bond pad is thus minimized. In addition, embodiments of the invention are easy to use where the end user can be trained quickly.

Figure 1:
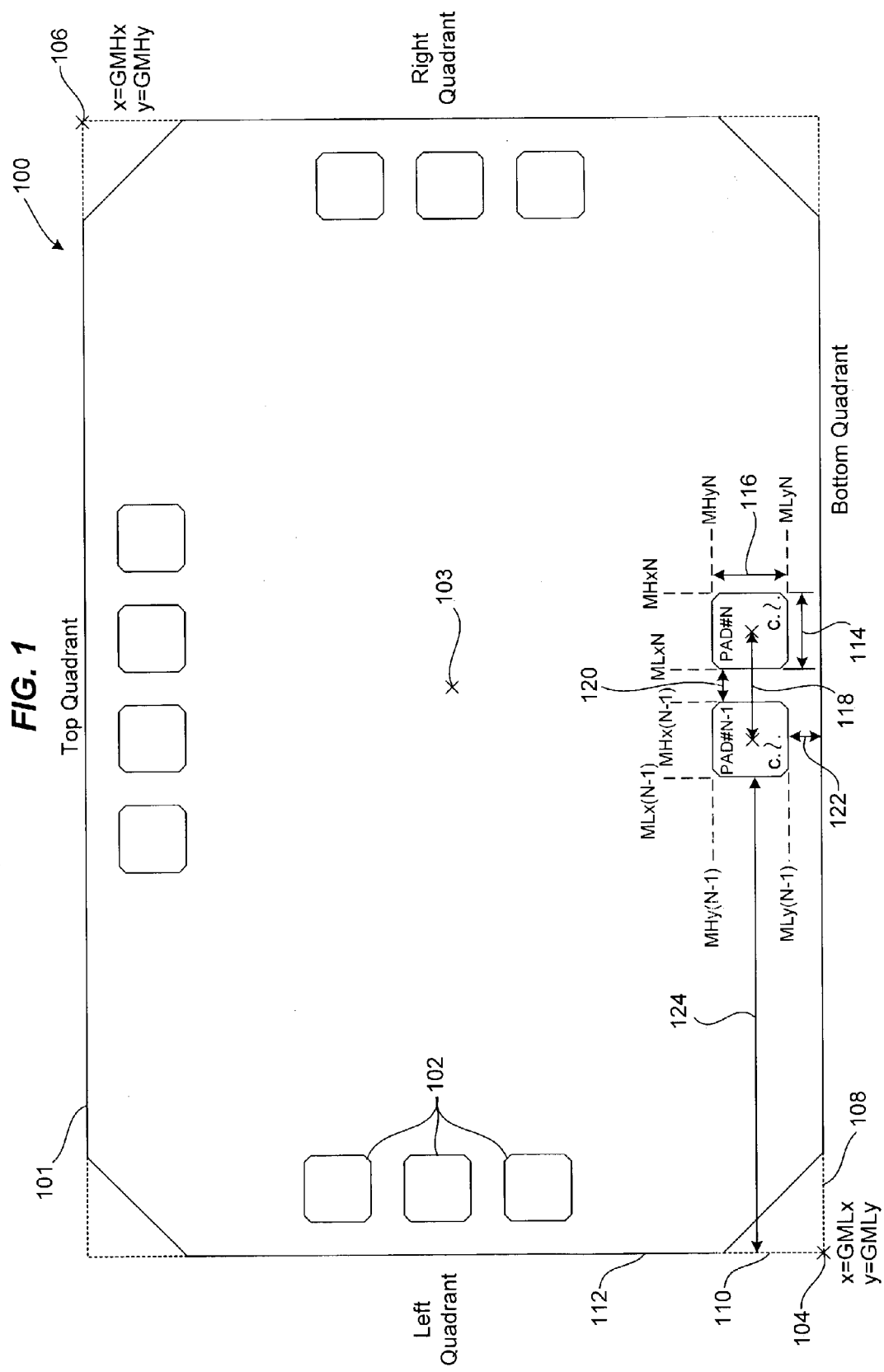
FIG. 1 is a screen shot illustrating a specific embodiment of the design verification methodology according to the present invention.

Referring to FIG. 1, a screen shot 100 of a specific embodiment of the design verification methodology according to the present invention is illustrated. Depicted on the screen is a drawing of a wire bond padring bond pad layout centered on the coordinates (0,0) 103. On the wire bond padring 101, there are a plurality of bond pads 102 arranged in linear arrays. In a specific embodiment, the linear arrays are arranged parallel to either the x-axis or the y-axis; however, in another embodiment, the linear arrays may be positioned having other orientations, e.g., at a diagonal. A first point 104 that is located on the bottom left position of the drawing has corresponding coordinates (GMLx, GMLy). Similarly, a last point 106 that is located on the top right position of the drawing has corresponding coordinates (GMHx, GMHy). The coordinates of the first point 104 and the last point 106 define the global variables. That is, the coordinates GMLx and GMHx define the vertical scribelines 110 whereas GMLy and GMHy define the horizontal scribelines 108. The scribelines generally correspond to the edges 112 of a semiconductor die or/and a die mask or/and the wire bond padring 101. The scribelines also define a closed loop area where it can be divided into a number of quadrants. According to a specific embodiment, there are four quadrants: Left, Right, Top, and Bottom. Further illustrated on the screen shot 100 are associated position values. Each bond pad 102 has associated position values that define the local variables. For example, for pad #(N−1), there are associated position values of MLx(N−1), MHx(N−1), MLy(N−1), and MHy(N−1). Likewise, for pad #(N), there are associated position values of MLx(N), MHx(N), MLy(N), and MHy(N). In any case, N would be assuming the values of: (N=2, 3, 4, 5, 6, 7, 8, 9 . . . etc).

Several measurements may be determined from the information illustrated by the screen shot 100. For instance, each bond pad's width 114 (x-axis bond pad opening); each bond pad's height 116 (y-axis bond pad opening); pad pitch 118 (using intersecting centerlines denoted as c.l.) between two bond pads; pad gap 120 between two bond pads; distance 122 from edge of each individual bond pad 102 to horizontal scribelines 108; and distance 124 from first and last bond pad 102 to vertical scribelines 110. These measurements comprise the bond pad position data and may be made on either linear arrays that are parallel to the x-axis or the y-axis.

Depending on which mapping system is used, whether rectangular coordinate system, polar coordinate system, some other system, or some combination of systems, the ability to reuse some portion or all of the logic in determining the bond pad position data could be realized. For example, according to a specific embodiment, the logic used for determining the bond pad position data for the top and bottom quadrants is the same. As for the left and right quadrants, they also share logic that is the same; however, the logic for the left and right quadrants vary from that of the top and bottom quadrants in that the logic for the top and bottom quadrants needs to be adjusted by a factor of polar ($\pi/2$) angular degrees. Since the left and right quadrants are orthogonal to the top and bottom quadrants, configuring the logic for the top and bottom quadrants to adjust by a factor of polar ($\pi/2$) angular degrees allows the ability to use a significant portion of the logic to acquire bond pad position data for bond pads positioned perpendicular to the x-axis (e.g., along the left and right quadrants). That is, the local variables of the linear array of bond pads for both the top and bottom quadrants involve just an incremental increase in the x-coordinate value while the y-coordinate value remains constant. On the other hand, the local variables of each linear array of bond pads for both the left and right quadrants involve an incremental increase in the y-coordinate value while the x-coordinate value remains constant. Therefore, based on this observation, a conversion of the associated position values for both the left and right quadrants into polar coordinates allows the ability to reuse some or all of the logic that was used for both the top and bottom quadrants in determining the bond pad position data. For instance, the left and right quadrants will effectively use the y-coordinate value in determining the bond pad position data for their respective quadrants.

Figure 2:
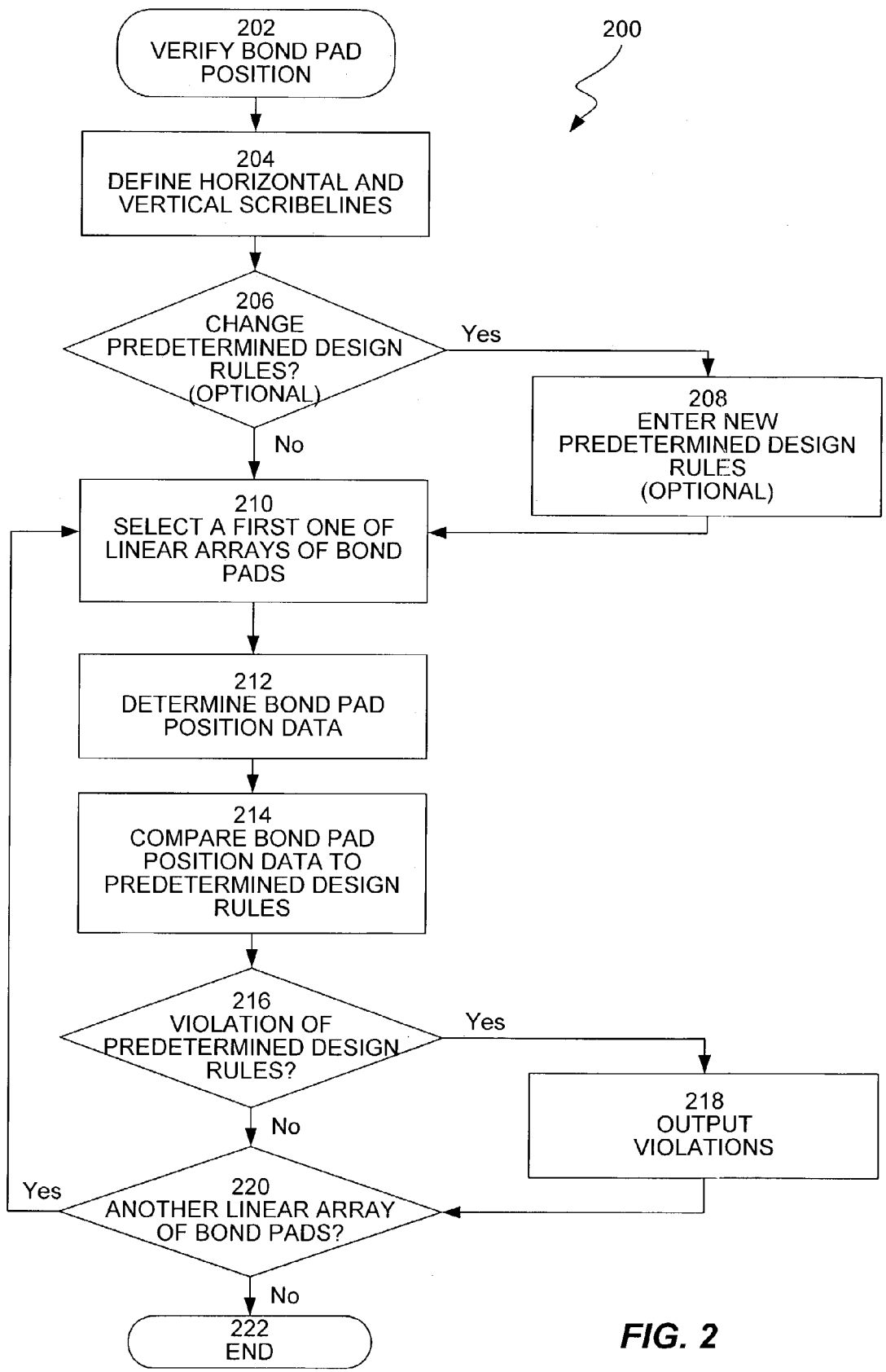
FIG. 2 is a process flowchart illustrating a specific embodiment of the design verification methodology of the present invention.

To understand the design verification methodology provided according to various embodiments of the invention, refer to the process flowchart 200 of FIG. 2. The designer first initiates a program subroutine in step 202 to verify bond pad positions. This is typically done after an electronic drawing file of a wire bond padring 101 is opened and displayed with corresponding coordinates on a monitor screen. In a specific embodiment, the subroutine is written using the AutoLISP® programming language, a form of LISP ("LISP" stands for list processing) programming language that is specially developed to integrate with software design tools such as AutoCAD®. The program subroutine in step 202 may be initiated by a variety of input commands, for example, entering a verify bond pad positions command.

Once the program subroutine in step 202 is initiated, the designer will be prompted to define the horizontal and vertical scribelines in step 204. The horizontal and vertical scribelines typically correspond to edges 112 of the semiconductor die. As for defining the horizontal and vertical scribelines, the designer may do this in a variety of ways. In a specific embodiment, a point and select technique is used. Upon selecting at least two points, usually by first selecting with a pointer a first point 104 in the bottom left position of the drawing and moving the pointer to a last point 106 in the top right position, an enclosed area will be formed and divided into a number of quadrants (e.g., Left, Right, Top, and Bottom). The coordinates (i.e., GMLx, GMLy, GMHx, and GMHy) of these selected points will define the global variables that are used later in step 212 when determining bond pad position data.

According to one embodiment, an optional step 206 is provided. Here, the designer is given a chance to change the predetermined design rules. This may involve changing the entire set of predetermined design rules or just individual parameters. That is, for example, the designer may choose another set of predetermined design rules based on which chip design family verification is preferred. On the other hand, the designer may just choose to change an individual parameter within an already loaded set of predetermined design rules. Either way, the option allows the designer to be flexible to the changing demands of other manufacturing processes during microchip fabrication. For example, if the packaging department changes their set of predetermined design rules based on a change of a corresponding die mask, the designer will have the ability to quickly perform the verification based on the new changes. Where the designer opts to change the predetermined design rules, an entry of new predetermined design rules may be exercised in optional step 208. Entry by the designer may be done in any conventional manner and even after acquiring proper access. For example, upon supplying a correct password to gain access, the designer may perform the entry by simply selecting the set of predetermined design rules that need changing and changing it to a new set of predetermined design rules.

When either defining the horizontal and vertical scribelines in step 204 or entering new predetermined design rules in step 208 is complete, the designer then selects a first one of linear arrays of bond pads in step 210. Typically, the selection is made when the designer chooses one quadrant corresponding to a first one of the linear arrays of bond pads. However, multiple quadrants may also be chosen. According to a specific embodiment, the selection is made using an automated offset object fencing selection command that automatically grabs the array of all bond pads corresponding to the chosen quadrant(s). Since the global variables at first point 104 (GMLx, GMLy) and last point 106 (GMHx, GMHy) were selected earlier in step 202, x and y rectangular coordinates for 4 points (e.g., (GMLx, GMLy); (GMHx, GMLy); (GMLx, GMHy); (GMHx, GMHy)) that help define the wire bond padring 101 are known. Utilizing these coordinates along with a predetermined selection height (a default offset distance value that may be altered in optional step 208), the algorithm for the automated offset object fencing selection command to automatically grab the array of all bond pads corresponding to the chosen quadrant(s) is as follows:

Bottom Quadrant (Bottom Array of Bond Pads where Y-Coordinate Values are Constant)

Using the horizontal scribeline at GMLy as a reference, the algorithm rotates the default selection height (typically set at polar zero angular degrees) by polar ($\pi c/2$) angular degrees in order to create a projected new imaginary line GMLy' that offsets the horizontal scribeline at GMLy by a value set by the predetermined selection height. That is, based on a rectangular coordinate system, placing an imaginary line GMLy' at a y-coordinate value that is greater than that for the horizontal scribeline at GMLy; in effect, positioning an imaginary line GMLy' above the horizontal scribeline at GMLy. Thus, a fencing window is created between GMLy and GMLy' that automatically grabs any bond pads positioned within it. As will be discussed later, bond pads that are positioned within this fencing window will have their associated position values grabbed, generally by using the AutoLISP® selection get function. Also, a counter counts the number of bond pads with associated position values grabbed and records it as bottom total pad check.

Left Quadrant (Left Array of Bond Pads where X-Coordinate Values are Constant)

Using the vertical scribeline at GMLx as a reference, the algorithm leaves the default selection height at the typical polar zero angular degrees setting in order to create a projected new imaginary line GMLx' that offsets the vertical scribeline at GMLx by a value set by the predetermined selection height. That is, based on a rectangular coordinate system, placing an imaginary line GMLx' at a x-coordinate value that is greater than that for the vertical scribeline at GMLx; in effect, positioning an imaginary line GMLx' to the right of the vertical scribeline at GMLx. Thus, a fencing window is created between GMLx and GMLx' that automatically grabs any bond pads positioned within it. As will be discussed later, bond pads that are positioned within this fencing window will have their associated position values grabbed, generally by using the AutoLISP® selection get function. Also, a counter counts the number of bond pads with associated position values grabbed and records it as left total pad check.

Top Quadrant (Top Array of Bond Pads where Y-Coordinate Values are Constant)

Using the horizontal scribeline at GMHy as a reference, the algorithm rotates the default selection height (typically set at polar zero angular degrees) by polar ($\pi/2$) angular degrees in order to create a projected new imaginary line GMHy' that offsets the horizontal scribeline at GMHy by a value set by the predetermined selection height. That is, based on a rectangular coordinate system, placing an imaginary line GMHy' at a y-coordinate value that is less than that for the horizontal scribeline at GMHy; in effect, positioning an imaginary line GMHy' below the horizontal scribeline at GMHy. Thus, a fencing window is created between GMHy and GMHy' that automatically grabs any bond pads positioned within it. As will be discussed later, bond pads that are positioned within this fencing window will have their associated position values grabbed, generally by using the AutoLISP® selection get function. Also, a counter counts the number of bond pads with associated position values grabbed and records it as top total pad check.

Right Quadrant (Right Array of Bond Pads where X-Coordinate Values are Constant)

Using the vertical scribeline at GMHx as a reference, the algorithm rotates the default selection height (typically set at polar zero angular degrees) by polar ($\pi$) angular degrees in order to create a projected new imaginary line GMHx' that offsets the vertical scribeline at GMHx by a value set by the predetermined selection height. That is, based on a rectangular coordinate system, placing an imaginary line GMHx' at a x-coordinate value that is less than that for the vertical scribeline at GMHx; in effect, positioning an imaginary line GMHx' to the left of the vertical scribeline at GMHx. Thus, a fencing window is created between GMHx and GMHx' that automatically grabs any bond pads positioned within it. As will be discussed later, bond pads that are positioned within this fencing window will have their associated position values grabbed, generally by using the AutoLISP® selection get function. Also, a counter counts the number of bond pads with associated position values grabbed and records it as right total pad check.

Once the automated offset object fencing selection command has automatically grabbed the array of all bond pads corresponding to the chosen quadrant(s), the number of bond pads 102 in the array is automatically counted. Although the counting can be done in various ways, the present invention implements incremental counters to run within 'while' and 'else' logical function loops during the automated offset object fencing selection command. For example, 'while' there are any closed polylines (specifically '8' sided closed polylines in the case of the construction of Altera's bond pads) residing inside the fencing window of the chosen quadrant(s) that have not been accounted for by the counter, the total pad check (i.e., counter) for the chosen quadrant(s) increments by 1. 'Else' the logical function loop ends. Besides automatically counting the number of bond pads in the array, entity information for each bond pad 102 in that array is also automatically retrieved. The entity information retrieved may include the drawing layer name (e.g., '23'), drawing entity type (e.g., 'LWPOLYLINE'), and the number of sides of any closed polylines (e.g., '8'). Further, the associated position values for each bond pad 102 in the array are automatically retrieved. That is, all associated position values that define the local variables (e.g., MLx, MHx, MLy, and MHy) for each bond pad 102 will be retrieved.

Step 212 involves determining bond pad position data to be used for the verification. In a specific embodiment, the determination is done with reference to the selected scribelines and the associated position values of each bond pad 102. That is, the coordinates of the selected scribelines and associated position values are used in determining the bond pad position data. Various embodiments of the invention employ a rectangular coordinate system for this determination. However, other coordinate systems, e.g., a polar system, may be employed. In Step 212, bond pad position data are automatically calculated with reference to the selected scribelines and the associated position values. According to a specific embodiment, the position data include: 1) Each bond pad width 114; 2) Each bond pad height 116; 3) Pad pitch 118 between adjacent bond pads; 4) Pad gap 120 between adjacent bond pads; 5) Distance 122 from edge of each individual bond pad 102 to horizontal scribeline 108; and 6) Distance 124 from edge of first and last bond pad 102 to vertical scribelines 110.

According to a particular implementation, the bond pad position data for the Bottom quadrant are calculated as follows:

1) Each bond pad width (X-axis bond pad opening).
   [Sample Calculation: (Bond Pad Reference #1=Bond Pad #(N−m));
   (Bond Pad Reference #2=Bond Pad #(N)).
   (m=1; N=2, 3, 4, 5, 6, 7, 8, 9 . . . etc).

$\{[(MHx(N-m))-GMLx]-[(MLx(N-m))-GMLx]\}.$

2) Each bond pad height (Y-axis bond pad opening).
   [Sample Calculation: (Bond Pad Reference #1=Bond Pad #(N−m));
   (Bond Pad Reference #2=Bond Pad #(N)).
   (m=1; N=2, 3, 4, 5, 6, 7, 8, 9 . . . etc).

$\{[(MHy(N-m))-GMLy]-[(MLy(N-m))-GMLy]\}.$

3) Pad pitch between two bond pads [between Bond Pad #(N−m) and Bond Pad #(N); m=1; N=2, 3, 4, 5, 6, 7, 8, 9 . . . etc].
   [Sample Calculation: (between Bond Pad #(N−m) and Bond Pad #(N)].

$$\left[\left(\frac{MHx(N)+MLx(N)}{2}\right)-\left(\frac{MHx(N-m)+MLx(N-m)}{2}\right)\right].$$

4) Pad gap between two bond pads [between Bond Pad #(N−m) and Bond Pad #(N); m=1; N=2, 3, 4, 5, 6, 7, 8, 9 . . . etc].
   [Sample Calculation: (between Bond Pad #(N−m) and Bond Pad #(N)].

$[(MLx(N)-MHx(N-m))].$

5) Distance from edge of each individual bond pad to horizontal scribeline.
   [Sample Calculation:

$[(MLy(N-m))-GMLy].$

6) Distance from first and last bond pad to vertical scribelines.
   [Sample Calculation: (for first bond pad);

$[(MLx(N-m))-GMLx].$

[Sample Calculation: (for last bond pad);

$[GMHx-(MHx(N))].$

According to another embodiment, the bonding pads may be selectively chosen for determining the bond pad position data. That is, the determination of bond pad position data may comprise data calculated from all bond pads or a subset of bond pads for the selected quadrant. Furthermore, the bond pad position data may include other necessary data for verifying wire bond padring bond pad layouts. Once the bond pad position data are determined, an automatic comparison between the bond pad position data and the predetermined design rules is performed in step 214. That is, an automatic determination is made as to whether the bond pad position data violate any of the limits set forth by the predetermined design rules.

When a violation has occurred, step 216, the violation is automatically outputted in step 218. According to a specific embodiment, the output of the violation is delivered onto the monitor for viewing against the drawing of the wire bond padring 101 bond pad layout. Generally, the violation is flagged on the monitor by some descriptive text or graphic format and arranged in a manner that is easily identifiable. For example, a text or an icon may be placed next to the bond pad that violates the predetermined design rules. That way, the designer may easily identify the problem area and know what violation has occurred. A color coding may also be implemented to assist in conveying information about the violation. A sample color coding scheme is as follows:

Red color=Error for pad width and pad height.
Yellow color=Error for distance from edge of bond pads to horizontal and vertical scribeline.
Green color=Error for pad pitch between two bond pads.
Light blue color=Error for pad gap between two bond pads.

According to another embodiment, output of the violation is delivered to an electronic file for saving or to a printer for printing. Other outputting methods may be appropriate as one of ordinary skill in the art would see fit.

When no violation has occurred, the designer will be given the option to continue with another linear array of bond pads in step 220. If the designer chooses to continue with another linear array of bond pads, the designer will be directed back to step 210 of the process flowchart 200. However, if the designer chooses not to continue with another linear array of bond pads, the designer will be directed to step 222 where the program subroutine ends.

Figure 3:
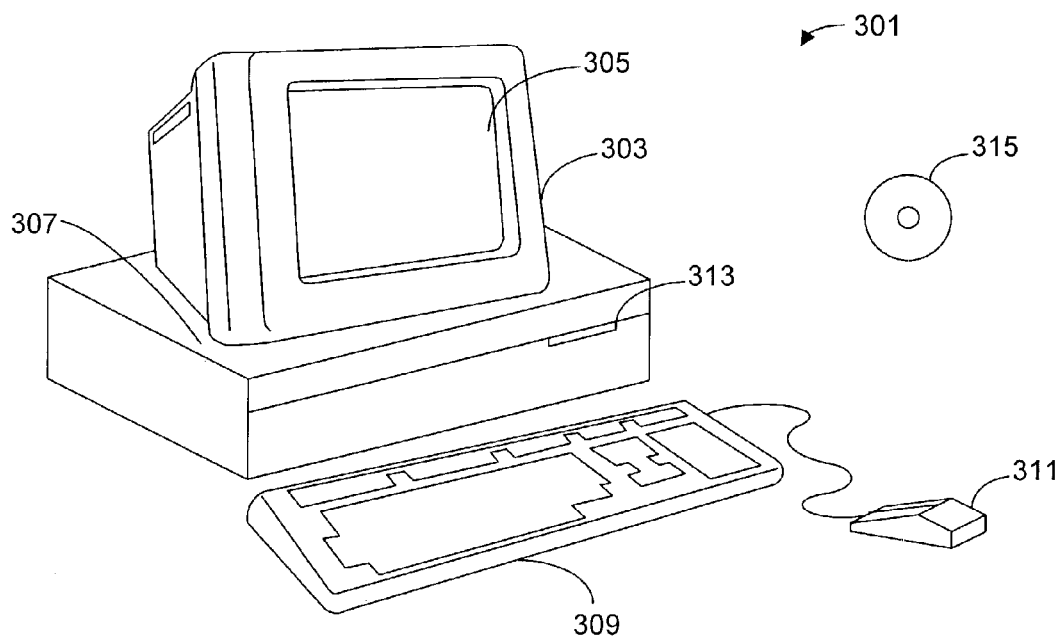
FIG. 3 is an example of a computer system that may be utilized to execute the software of an embodiment of the invention.

FIG. 3 illustrates an example of an apparatus, such as a computer system that may be used to execute the software of an embodiment of the invention. FIG. 3 shows a computer system 301 that includes a display 303, screen 305, cabinet 307, keyboard 309, and mouse 311. Mouse 311 may have one or more buttons for interacting with a graphical user interface. Cabinet 307 houses a CD-ROM drive 313, system memory and a hard drive (see FIG. 4) which may be utilized to store and retrieve software programs incorporating computer code that implements the invention, data for use with the invention, and the like. Although the CD-ROM 315 is shown as an exemplary computer readable storage medium, other computer readable storage media including floppy disks, tape, flash memory, system memory, and hard drives may be utilized.

Figure 4:
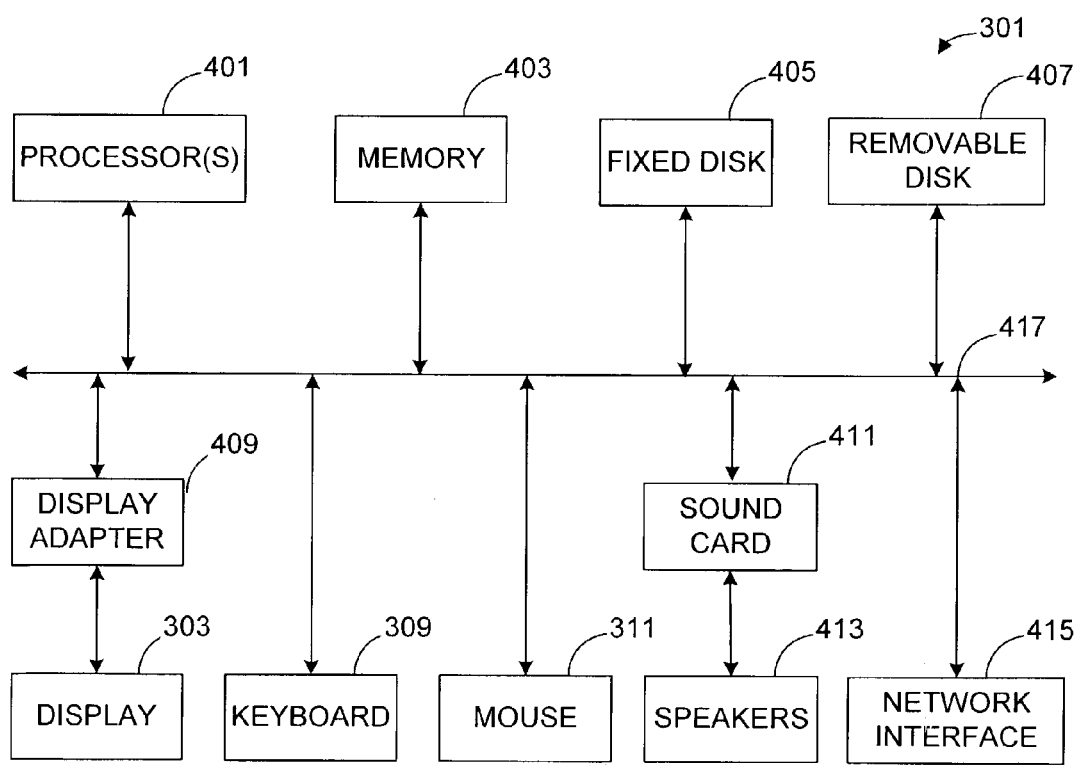
FIG. 4 shows a system block diagram of the computer system of FIG. 3.

FIG. 4 shows a system block diagram of computer system 301 used to execute the software of an embodiment of the invention. As in FIG. 3, computer system 301 includes monitor 303 and keyboard 309, and mouse 311. Computer system 301 further includes subsystems such as a central processor 401, system memory 403, fixed disk 405 (e.g., hard drive), removable disk 407 (e.g., CD-ROM drive), display adapter 409, sound card 411, speakers 413, and network interface 415. Other computer systems suitable for use with the invention may include additional or fewer subsystems. For example, another computer system could include more than one processor 401 (i.e., a multi-processor system), or a cache memory.

The system bus architecture of computer system 301 is represented by arrows 417. However, these arrows are illustrative of any interconnection scheme serving to link the subsystems. For example, a local bus could be utilized to connect the central processor to the system memory and display adapter. Computer system 301 shown in FIG. 4 is but an example of a computer system suitable for use with the invention. Other computer architectures having different configurations of subsystems may also be utilized.

In addition to methods, apparatus, and computer program products, this invention also relates to programmable logic devices and other target hardware devices having padring designs verified in accordance with the above-described methods.

A PLD is a programmable integrated circuit that allows the user of the circuit, using software control, to customize the logic functions the circuit will perform. Examples of PLDs are FPGAs (Field Programmable Gate Arrays) and EPLDs (Erasable Programmable Logic Devices). The logic functions previously performed by small, medium and large scale integration integrated circuits can instead be performed by programmable logic devices. Programmable logic devices supplied by integrated circuit manufacturers like Altera Corporation of San Jose, Calif. (a more detailed description of these products can be found at "www.altera.com") are not inherently capable of performing any specific function. The user, in conjunction with software supplied by the PLD manufacturer, can program the PLD to perform the specific function or functions required by the user's application. The PLD then can function in a larger system designed by the user, just as though dedicated logic chips were employed.

A typical PLD consists of an array of logic cells that can be individually programmed and arbitrarily interconnected to each other to provide internal input and output signals, thus permitting the performance of highly complex combinational and sequential logic functions. The program is implemented in the PLD by setting the states of programmable elements such as memory cells. These memory cells may be implemented with volatile memories, such as SRAMs, which lose their programmed states upon termination of power to the system. If the programmable elements used are volatile memories, the memory cells must be configured upon each system power-up in order to configure the PLD.

The foregoing describes the instant invention and its presently preferred embodiments. Numerous modifications and variations in the practice of this invention are expected to occur to those skilled in the art. For instance, the techniques and systems of the present invention are suitable for use with a wide variety of EDA (Electronic Design Automation) tools and methodologies for designing, simulating, compiling and/or programming a device. Therefore, the described embodiments should be taken as illustrative and not restrictive, and the invention should not be limited to the details given herein but should be defined by the following claims and their full scope of equivalents.

What is claimed is:

1. A computer-implemented method for verifying bond pad position conformity with predetermined design rules corresponding to a padring design, the padring design including a plurality of linear arrays of bond pads, comprising:

defining horizontal and vertical scribelines for the padring design;

selecting a first one of the linear arrays of bond pads, each bond pad having associated position values;

determining bond pad position data with reference to the scribelines and the associated position values without user intervention;

comparing the bond pad position data to the predetermined design rules without user intervention; and identifying any violations of the predetermined design rules.

2. A computer-implemented method as recited in claim 1, further comprising changing the predetermined design rules.

3. A computer-implemented method as recited in claim 1, wherein defining horizontal and vertical scribelines comprises selecting at least two points on a coordinate system.

4. A computer-implemented method as recited in claim 3, wherein the at least two points correspond to opposing corners of a rectangle enclosing the padring design.

5. A computer-implemented method as recited in claim 4, wherein the rectangle corresponds to edges of a semiconductor die.

6. A computer-implemented method as recited in claim 1, wherein selecting the first one of the linear arrays comprises employing an automated offset object fencing selection command.

7. A computer-implemented method as recited in claim 6, wherein the automated offset object fencing selection command is provided in a CAD environment.

8. A computer-implemented method as recited in claim 6, wherein the automated offset object fencing selection command comprises:
  selecting the bond pads in the first one of the linear arrays;
  counting the number of bond pads in the first one of the linear arrays;
  retrieving all entity information for each bond pad in the first one of the linear arrays; and
  retrieving the associated position values for each bond pad in the first one of the linear arrays.

9. A computer-implemented method as recited in claim 8, wherein selecting the bond pads in the first one of the linear arrays comprises:
  creating a fencing window enclosing an area in the first one of the linear arrays, wherein the fencing window is determined by a predetermined selection height; and
  grabbing any bond pads positioned within the fencing window.

10. A computer-implemented method as recited in claim 8, wherein counting the number of bond pads in the first one of the linear arrays comprises using a logical function loop.

11. A computer-implemented method as recited in claim 8, wherein the entity information includes drawing layer name, drawing entity type, or number of sides of any closed polyline.

12. A computer-implemented method as recited in claim 8, wherein retrieving the associated position values for each bond pad in the first one of the linear arrays comprises using an AutoLISP® selection get function.

13. A computer-implemented method as recited in claim 1, wherein the associated position values for a particular bond pad represent edges of the particular bond pad.

14. A computer-implemented method as recited in claim 1, wherein determining bond pad position data comprises determining any of bond pad width, height, pitch, gap, distance from horizontal scribeline, or distance from vertical scribeline.

15. A computer-implemented method as recited in claim 14, wherein distance from vertical scribeline is determined only for a subset of the bond pads in the first one of the linear arrays.

16. A computer-implemented method as recited in claim 14, wherein distance from horizontal scribeline is determined only for a subset of the bond pads in the first one of the linear arrays.

17. A computer-implemented method as recited in claim 1, wherein the predetermined design rules comprise limits on bond pad spacing, and wherein comparing the bond pad position data to the predetermined design rules comprises comparing the bond pad position data to the limits.

18. A computer-implemented method as recited in claim 17, wherein identifying the violations comprises identifying when the bond pad position data violate the limits.

19. A computer-implemented method as recited in claim 1, further comprising communicating the violations.

20. A computer-implemented method as recited in claim 19, wherein communicating the violations comprises printing, displaying or storing the violations.

21. A computer-implemented method as recited in claim 19, wherein communicating the violations comprises using text or symbols.

22. A computer-implemented method as recited in claim 19, wherein communicating the violations comprises using color-coding.

23. A computer-implemented method as recited in claim 1, further comprising selecting a next one of the linear arrays of bond pads for determining and comparing.

24. A computer-implemented method as recited in claim 23, further comprising terminating the method when all of the linear arrays of bond pads are done.

25. A computer-implemented method as recited in claim 23, further comprising transforming the associated position values corresponding to the next one of the linear arrays into an alternate coordinate system where the next one of linear arrays is oriented along a different axis than the first one of the linear arrays.

26. An integrated circuit comprising a substrate and a padring corresponding to a padring design, the padring design having been verified according to a method for verifying bond pad position conformity with predetermined design rules, the padring design including a plurality of linear arrays of bond pads, the method comprising:
  defining horizontal and vertical scribelines for the padring design;
  selecting a first one of the linear rays of bond pads, each bond pad having associated position values;
  determining bond pad position data with reference to the scribelines and the associated position values without user intervention;
  comparing the bond pad position data to the predetermined design rules without user intervention; and
  identifying any violations of the predetermined design rules.

27. An integrated circuit as recited in claim 26, wherein the integrated circuit is a programmable logic device.

28. An integrated circuit as recited in claim 26, wherein bond pad position data is selected from the group consisting of bond pad width, height, pitch, gap, distance from horizontal scribeline, and distance from vertical scribeline.

29. At least one computer readable medium containing program instructions for verifying bond pad position conformity with predetermined design rules corresponding to a padring design that includes a plurality of linear arrays of bond pads, the at least one computer readable medium comprising:
  computer readable code for defining horizontal and vertical scribelines for the padring design;
  computer readable code for selecting a first one of the linear arrays of bond pads, each bond pad having associated position values;
  computer readable code for determining bond pad position data with reference to the scribelines and the associated position values without user intervention;

computer readable code for comparing the bond pad position data to the predetermined design rules without user intervention; and computer readable code for identifying any violations of the predetermined design rules.

30. The at least one computer readable medium of claim 29, further comprising computer readable code for changing the predetermined design rules.

31. The at least one computer readable medium of claim 29 wherein the computer readable code for defining horizontal and vertical scribelines is operable to select at least two points on a coordinate system.

32. The at least one computer readable medium of claim 31 wherein the at least two points correspond to opposing corners of a rectangle enclosing the padring design.

33. The at least one computer readable medium of claim 32 wherein the rectangle corresponds to edges of a semiconductor die.

34. The at least one computer readable medium of claim 32 wherein the computer readable code for selecting the bond pads in the first one of the linear arrays comprises:

creating a fencing window enclosing an area in the first one of the linear arrays, wherein the fencing window is determined by a predetermined selection height; and grabbing any bond pads positioned within the fencing window.

35. The at least one computer readable medium of claim 32 wherein the computer readable code for counting the number of bond pads in the first one of the linear arrays comprises using a logical function loop.

36. The at least one computer readable medium of claim 32 wherein the entity information includes drawing layer name, drawing entity type, or number of sides of any closed polyline.

37. The at least one computer readable medium of claim 32 wherein the computer readable code for retrieving the associated position values for each bond pad in the first one of the linear arrays comprises using an AutoLISP® selection get function.

38. The at least one computer readable medium of claim 29 wherein the computer readable code for selecting the first one of the linear arrays is operable to employ an automated offset object fencing selection command.

39. The at least one computer readable medium of claim 38 wherein the automated offset object fencing selection command is provided in a CAD environment.

40. The at least one computer readable medium of claim 38 wherein the automated offset object fencing selection command comprises:

computer readable code for selecting the bond pads in the first one of the linear arrays;

computer readable code for counting the number of bond pads in the first one of the linear arrays;

computer readable code for retrieving all entity information for each bond pad in the first one of the linear arrays; and computer readable code for retrieving the associated position values for each bond pad in the first one of the linear arrays.

41. The at least one computer readable medium of claim 29 wherein the associated position values for a particular bond pad represent the edges of the particular bond pad.

42. The at least one computer readable medium of claim 29 wherein the computer readable code for determining bond pad position data is operable to determine any of bond pad width, height, pitch, gap, distance from horizontal scribeline, or distance from vertical scribeline.

43. The at least one computer readable medium of claim 42 wherein distance from vertical scribeline is determined only for a subset of the bond pads in the first one of the linear arrays.

44. The at least one computer readable medium of claim 42 wherein distance from horizontal scribeline is determined only for a subset of the bond pads in the first one of the linear arrays.

45. The at least one computer readable medium of claim 29 wherein the predetermined design rules comprise limits on bond pad spacing, and wherein the computer readable code for comparing the bond pad position data to the predetermined design rules is operable to compare the bond pad position data to the limits.

46. The at least one computer readable medium of claim 45 wherein the computer readable code for identifying the violations is operable to identify when the bond pad position data violate the limits.

47. The at least one computer readable medium of claim 29, further comprising computer readable code for communicating the violations.

48. The at least one computer readable medium of claim 29, further comprising computer readable code for selecting a next one of the linear arrays of bond pads for determining and comparing.

49. The at least one computer readable medium of claim 48, further comprising computer readable code for transforming the associated position values corresponding to the next one of the linear arrays into an alternate coordinate system where the next one of linear arrays is oriented along a different axis than the first one of the linear arrays.

50. The at least one computer readable medium of claim 29 wherein the program instructions comprise a CAD program.

51. The at least one computer readable medium of claim 29, wherein bond pad position data is selected from the group consisting of bond pad width, height, pitch, gap, distance from horizontal scribeline, and distance from vertical scribeline.

52. A computer system comprising:

a central processing unit;

a display;

a keyboard; and memory having program instructions stored therein for designing a circuit designed by a method for verifying bond pad position conformity with predetermined design rules corresponding to a padring design that includes a plurality of linear arrays of bond pads, the memory comprising:

computer readable code for defining horizontal and vertical scribelines for the padring design;

computer readable code for selecting a first one of the linear arrays of bond pads, each bond pad having associated position values;

computer readable code for determining bond pad position data with reference to the scribelines and the associated position values without user intervention;

computer readable code for comparing the bond pad position data to the predetermined design rules without user intervention; and computer readable code for identifying any violations of the predetermined design rules.

53. The computer system of claim 52, wherein bond pad position data is selected from the group consisting of bond pad width, height, pitch, gap, distance from horizontal scribeline, and distance from vertical scribeline.

* * * * *